(12) United States Patent
Ma (10) Patent No.: US 11,968,812 B2
(45) Date of Patent: Apr. 23, 2024

(54) DISPLAY DEVICE AND ELECTRONIC DEVICE (71) Applicant: BOE TECHNOLOGY GROUP CO., LTD., Beijing (CN)

(72) Inventor: Chao Ma, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 922 days.

(21) Appl. No.: 16/935,753

(22) Filed: Jul. 22, 2020

(65) Prior Publication Data
US 2021/0100139 A1 Apr. 1, 2021

(30) Foreign Application Priority Data
Sep. 27, 2019 (CN) .......................... 201910922816.2

(51) Int. Cl.
*G01K 7/22* (2006.01)
*H05B 1/02* (2006.01)
(Continued)

(52) U.S. Cl.
CPC .......... *H05K 7/20954* (2013.01); *G01K 7/22* (2013.01); *H05B 1/023* (2013.01); *H05B 3/03* (2013.01);
(Continued)

(58) Field of Classification Search
CPC ...... H05K 7/20954; G01K 7/22; H05B 1/023; H05B 3/03; H05B 3/84; G02F 1/133382; H01L 23/345
(Continued)

(56) References Cited

U.S. PATENT DOCUMENTS 4,952,783 A * 8/1990 Aufderheide ..... G02F 1/133382
219/528
9,983,171 B2 * 5/2018 Jiao ...................... G01N 27/048
(Continued)

FOREIGN PATENT DOCUMENTS

CN 201594162 U 9/2010
CN 102879936 A 1/2013
(Continued)

OTHER PUBLICATIONS

Chinese Office Action issued in corresponding Chinese Patent Application No. 201910922816.2, dated Feb. 3, 2021, with English translation.

*Primary Examiner* — Timothy J Thompson
*Assistant Examiner* — Michael F McAllister
(74) *Attorney, Agent, or Firm* — McDermott Will & Emery LLP (57) ABSTRACT A display device and an electronic device are provided. The display device includes: a display screen; an electrically heated glass layer stacked onto the display screen, which includes a first transparent glass layer and a transparent conductive film layer, the transparent conductive film layer and the first transparent glass layer being stacked onto the display screen; a thermistor disposed adjacent to the display screen, for detecting a temperature of the display screen or a temperature at a position adjacent to the display screen; and a flexible circuit board, wherein an electrical connection terminal is provided on the transparent conductive film layer, the electrical connection terminal is electrically connected with the flexible circuit board, and the thermistor is electrically connected with the flexible circuit board.

20 Claims, 5 Drawing Sheets (51) Int. Cl.
  *H05B 3/03*    (2006.01)
  *H05B 3/84*    (2006.01)
  *H05K 7/20*    (2006.01)
  *G02F 1/1333*  (2006.01)
  *H01L 23/34*   (2006.01)

(52) U.S. Cl.
  CPC ......... *H05B 3/84* (2013.01); *G02F 1/133382* (2013.01); *H01L 23/345* (2013.01); *H05B 2203/013* (2013.01); *H05B 2203/016* (2013.01)

(58) Field of Classification Search
  USPC ........................................................ 361/749
  See application file for complete search history.

(56) References Cited

U.S. PATENT DOCUMENTS

| | | | | |
|---|---|---|---|---|
| 11,780,594 | B2* | 10/2023 | Duarte | G08C 17/02 |
| | | | | 244/134 D |
| 2020/0022275 | A1* | 1/2020 | Vemulapally | G01K 1/14 |

FOREIGN PATENT DOCUMENTS

| | | |
|---|---|---|
| CN | 103592789 A | 2/2014 |
| CN | 205124022 U | 3/2016 |
| CN | 207337001 U | 5/2018 |
| CN | 209086624 U | 7/2019 |
| EP | 0609088 A2 | 8/1994 |

\* cited by examiner

DISPLAY DEVICE AND ELECTRONIC DEVICE

CROSS-REFERENCE TO RELATED APPLICATION

This application claims the benefit of Chinese Patent Application No. 201910922816.2 filed on Sep. 27, 2019 in the National Intellectual Property Administration of China, the whole disclosure of which is incorporated herein by reference.

TECHNICAL FIELD

The present disclosure relates to the field of electronic device technology, in particular to a display device and an electronic device.

BACKGROUND

There are many types of display screens, including liquid crystal displays (LCD), organic light emitting diode displays (OLED) and inorganic light emitting diode displays (LED). With the advancement of technology, the display screens are used in various environments, including high temperature environment, low temperature environment and humid environment, etc. However, the low temperature environment has a certain influence on the normal display of the display screens, thus it is required for the technical personnel to make further research on the anti-low-temperature performance of the display screens.

SUMMARY

In one aspect, a display device is provided, wherein the display device includes: a display screen; an electrically heated glass layer stacked onto the display screen, the electrically heated glass layer including: a first transparent glass layer; and a transparent conductive film layer, the transparent conductive film layer and the first transparent glass layer being stacked onto the display screen; a thermistor disposed adjacent to the display screen, for detecting a temperature of the display screen or a temperature at a vicinity of the display screen; and a flexible circuit board, wherein an electrical connection terminal is provided on the transparent conductive film layer, the electrical connection terminal is electrically connected with the flexible circuit board, and the thermistor is electrically connected with the flexible circuit board.

According to some exemplary embodiments, the electrical connection terminal includes a positive electrode and a negative electrode, the positive electrode and the negative electrode are both disposed in a conductive layer on a surface of the transparent conductive film layer close to the display screen, and the flexible circuit board is electrically connected to the positive electrode and the negative electrode, respectively.

According to some exemplary embodiments, the flexible circuit board is disposed along a side of the transparent conductive film layer, the flexible circuit board includes a first portion, and the first portion of the flexible circuit board is sandwiched between the display screen and the transparent conductive film layer.

According to some exemplary embodiments, an electrical connection between the flexible circuit board and each of the positive electrode and the negative electrode is a surface connection.

According to some exemplary embodiments, the thermistor is adhered to the flexible circuit board, and a part of the flexible circuit board is bent so that the thermistor is in contact with a side end of the display screen.

According to some exemplary embodiments, the display device further includes: a first optical adhesive layer between the display screen and the transparent conductive film layer.

According to some exemplary embodiments, the first portion of the flexible circuit board is located on the same layer as the first optical adhesive layer, and a thickness of the first optical adhesive layer is substantially equal to a sum of a thickness of the conductive layer and a thickness of the first portion of the flexible circuit board.

According to some exemplary embodiments, the display device further includes: a second transparent glass layer between the display screen and the first optical adhesive layer.

According to some exemplary embodiments, the thermistor is adhered to the flexible circuit board, and a part of the flexible circuit board is bent so that the thermistor is in contact with a side end of the display screen and the bent flexible circuit board wraps a side end of the second transparent glass layer.

According to some exemplary embodiments, the display device further includes silica gel, the silica gel is in contact with the side end of the display screen, and the silica gel is in contact with the thermistor.

According to some exemplary embodiments, there are a plurality of thermistors, and the plurality of thermistors are adhered to the side end of the display screen at an interval.

According to some exemplary embodiments, the thermistor is adhered to the flexible circuit board, and a part of the flexible circuit board is bent so that the thermistor is in contact with a side end of the first transparent glass layer.

According to some exemplary embodiments, the transparent conductive film layer is disposed between the display screen and the first transparent glass layer.

According to some exemplary embodiments, the display device further includes: a third transparent glass layer on a surface of the first transparent glass layer away from the transparent conductive film layer.

According to some exemplary embodiments, the display device further includes a second optical adhesive layer and the fourth transparent glass layer, the display screen, the first transparent glass layer, the transparent conductive film layer, the second optical adhesive layer and the fourth transparent glass layer are sequentially stacked.

According to some exemplary embodiments, the display device further includes a shielding glass layer on a surface of the display screen away from the electrically heated glass layer.

According to some exemplary embodiments, the transparent conductive film layer includes ITO, and/or the conductive layer includes copper.

In another aspect, an electronic device is provided, wherein the electronic device includes the display device as described above.

According to some exemplary embodiments, the electronic device further includes a processor, and the thermistor is electrically connected to the processor through the flexible circuit board, and the processor is configured to: determine a temperature change of the display screen according to a resistance value change of the thermistor; and output a control signal according to the temperature change of the display screen.

According to some exemplary embodiments, the electronic device further includes a power supply device, and the power supply device is electrically connected to the electrical connection terminal through the flexible circuit board, and the power supply device is configured to supply electrical power to the electrical connection terminal or stop supplying electrical power to the electrical connection terminal in response to the control signal.

DETAILED DESCRIPTION OF EMBODIMENTS

In order to further elaborate on the technical means and effects adopted by the present disclosure to achieve the intended purpose of the disclosure, specific implementations, structures, features, and effects of a display device and an electronic device according to the present disclosure will be described in detail with reference to the drawings and the embodiments.

In the context, an expression "one embodiment" or "an embodiment" does not necessarily refer to the same embodiment. In addition, specific features, structures, or characteristics in one or more embodiments may be combined in any suitable form.

It should be noted that although the terms "first", "second", or the like may be used herein to describe various components, members, elements, regions, layers and/or portions, these components, members, elements, regions, layers and/or portions should not be limited by these terms. Rather, these terms are used to distinguish one component, member, element, region, layer, and/or portion from another. Thus, for example, the first component, first member, first element, first region, first layer, and/or first portion discussed below may be referred to as the second component, second member, second element, second region, second layer and/or second portion without departing from the teachings of the present disclosure.

Herein, an expression "thickness" may refer to a dimension of each film layer, component or portion in a direction perpendicular to a display surface of the display screen.

As shown in FIG. 1 to FIG. 3 and FIG. 6 to FIG. 7, some exemplary embodiments of the present disclosure provide a display device, which includes a display screen 1 and an electrically heated glass layer 2 that are stacked onto each other. The electrically heated glass layer 2 includes a first transparent glass layer 21 and a transparent conductive film layer 22 that are stacked onto each other.

For example, the display screen 1 is a core component of a display device for displaying images, and the display screen 1 provided by some embodiments of the present disclosure may be one of a liquid crystal display screen (LCD), an organic light-emitting diode display screen (OLED), and an inorganic light-emitting diode display screen (LED), which may be selected according to actual practical needs.

Figure 1:
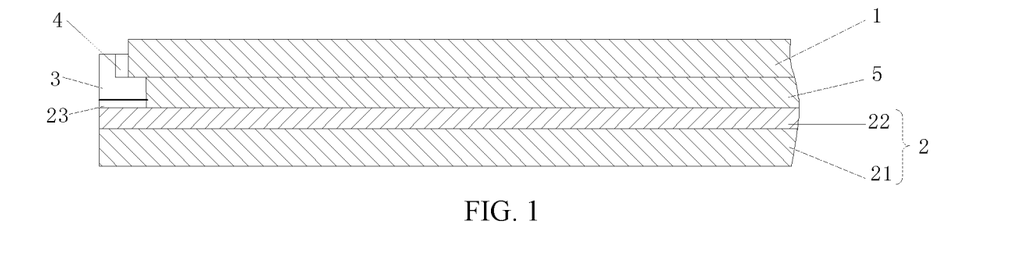
FIG. 1 to FIG. 5 are schematic structural views of display devices according to some exemplary embodiments of the present disclosure.
Figure 6:
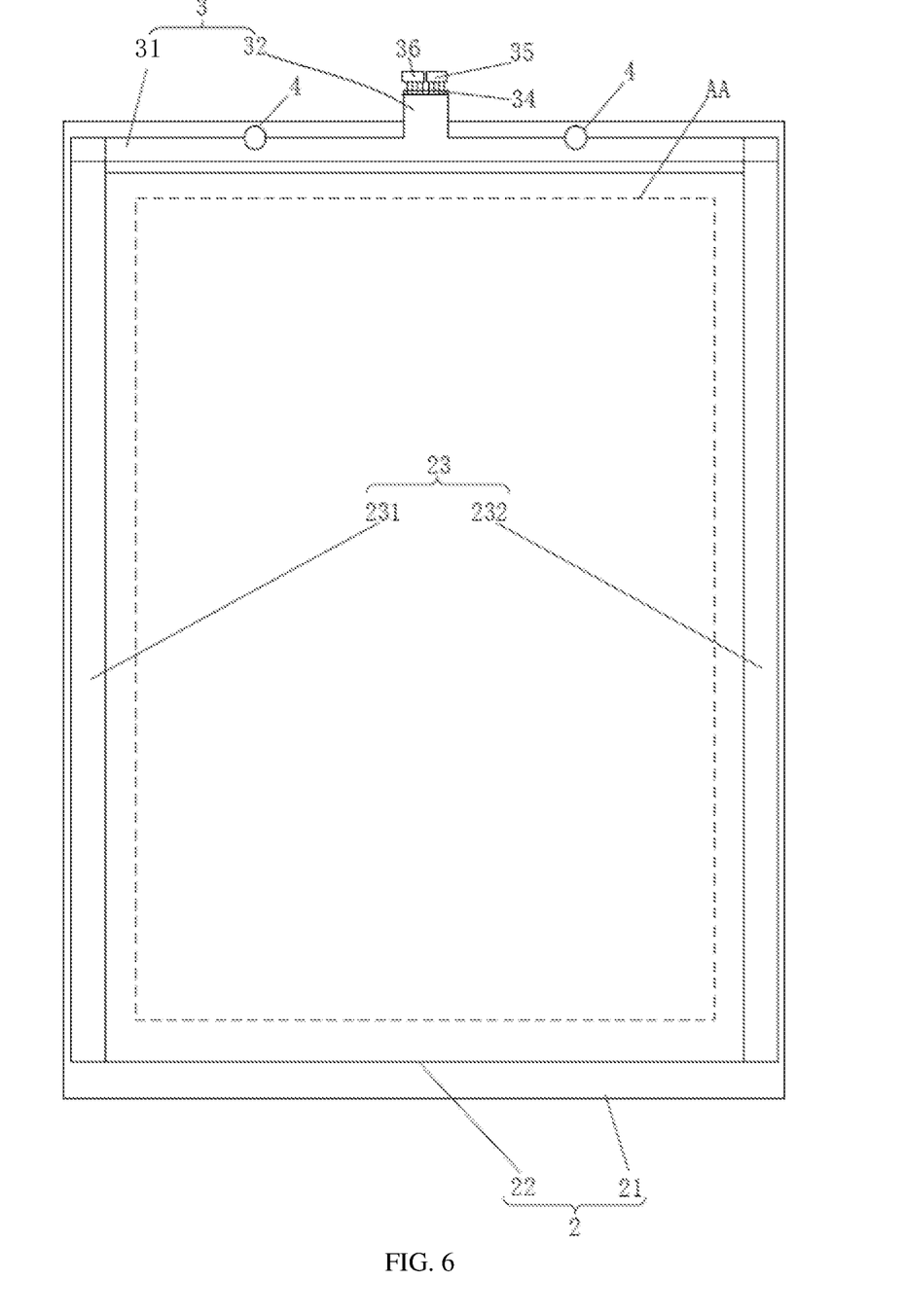
FIG. 6 is a schematic structural view of an electrically heated glass layer of a display device according to some exemplary embodiments of the present disclosure.

As shown in FIG. 1 and FIG. 6, the electrically heated glass layer 2 further includes an electrical connection terminal 23 provided at a side edge of the transparent conductive film layer 22. For example, the electrical connection terminal 23 includes a positive electrode 231 and a negative electrode 232. The positive electrode 231 and the negative electrode 232 are electrically connected to the flexible circuit board 3. In the embodiments shown in FIG. 6, the display screen 1 includes a display area AA, and an orthographic projection of the electrical connection terminal 23 on the display screen 2 does not fall into the display area AA. Specifically, the positive electrode 231 and the negative electrode 232 are respectively located on both sides of the display area AA, and orthographic projections of the positive electrode 231 and the negative electrode 232 on the display screen 2 are spaced apart from the display area AA.

The thermistor 4 is electrically connected to the flexible circuit board 3. As shown in FIG. 1, the thermistor 4 is disposed close to the display screen 1, for example, surface mounted on a side of the display screen 1, so as to detect the temperature of the display screen 1.

As shown in FIG. 1 and FIG. 6, the flexible circuit board 3 is disposed along a side of the transparent conductive film layer 22, and a part of the flexible circuit board 3 is located in a laminated structure of the display device, that is, the part of the flexible circuit board 3 is sandwiched between the transparent conductive film layer 22 and the display screen 1. The remaining part of the flexible circuit board 3 is located outside the stacked portion of the display screen 1 and the electrically heated glass layer 2, so as to connect a processor (for example, an integrated chip (IC)). As shown in FIG. 6, the flexible circuit board 3 includes a bonding area 34 in which a plurality of electrical connection terminals are provided. The electrical connection terminals may be electrically connected to the processor (for example, the integrated chip (IC)) 35.

The electrically heated glass layer 2 includes a base transparent glass layer (i.e., a first transparent glass layer) 21 and a transparent conductive film layer 22 that are stacked onto each other. The transparent conductive film layer 22 may be an ITO (indium tin oxide) film layer. For example, the transparent conductive film layer 22 may be prepared on a surface of the first transparent glass layer 21 by sputtering, coating, or vapor deposition. The thickness of the ITO film layer may be set according to actual practical needs, and are not specifically limited in the embodiments of the present disclosure. The positive electrode 231 and the negative electrode 232 provided on the transparent conductive film layer 22 may be copper electrodes. For example, the positive electrode 231 and the negative electrode 232 may be prepared on a surface of the transparent conductive film layer 22 by sputtering, coating, or vapor deposition. For example, the transparent conductive film layer 22 is located between the first transparent glass layer 21 and the display screen 1, and the positive electrode 231 and the negative electrode 232 are located on the surface of the transparent conductive film layer 22 facing the display screen 1.

The flexible circuit board 3 is a flexible printed circuit board with high reliability, which is made of polyimide or polyester film as the base material, it is referred to as a flexible board or FPC, and has characteristics of high wiring density, light weight and thin thickness. The flexible circuit board 3 may be provided with multiple data channels or current channels, so that the flexible circuit board 3 may be electrically connected to the positive electrode 231, the negative electrode 232, and the thermistor 4. The flexible circuit board 3 provided in the embodiments of the present disclosure is used to electrically connect the positive electrode 231 and the negative electrode 232 of the transparent conductive film layer 22 with the processor 35, so as to supply the electrical power to the transparent conductive film layer 22 under the control of the processor 35 to heat the display screen 1 through the transparent conductive film layer 22.

The thermistor 4 is a type of sensitive elements, which may include a positive temperature coefficient thermistor (PTC) and a negative temperature coefficient thermistor (NTC) according to different temperature coefficients. The thermistor 4 is typically characterized in that it is sensitive to temperature and exhibits different resistance values at different temperatures. For the positive temperature coefficient thermistor (PTC), its resistance value is increased as the temperature becomes high, and for the negative temperature coefficient thermistor (NTC), its resistance value is decreased as the temperature becomes high. They both belong to semiconductor devices. The thermistor 4 provided by the embodiments of the present disclosure may be the above-mentioned positive temperature coefficient thermistor, or may be the negative temperature coefficient thermistor. For example, the thermistor 4 may be a chip thermistor.

The thermistor 4 is disposed adjacent to the display screen 1 or attached to the display screen 1. Specifically, after the display screen 1 is heated by the electrically heated glass layer 2, as the temperature of the display screen 1 changes, the resistance value of the thermistor 4 may change. The thermistor 4 is electrically connected to the processor 35 through the flexible circuit board 3, and the processor 35 may calculate the temperature change of the display screen 1 according to the resistance value change of the thermistor 4. In this way, feedback of the temperature change of the display screen 1 may be realized. The processor 35 may determine whether to continue to supply electrical power to the transparent conductive film layer 22 according to the feedback of the temperature change, so as to continue to adjust the heating temperature of the display screen 1. In this way, the heating temperature of the display screen 1 may be ensured within an appropriate range.

For example, the display screen 1 and the electrically heated glass layer 2 may be assembled by a full bonding process, and the electrically heated glass layer 2 may be disposed on any one of two opposing surfaces of the display screen 1. Optionally, the electrically heated glass layer 2 may be provided on a surface on a side for displaying images.

In the display device provided by the embodiments of the present disclosure, the electrically heated glass layer 2 is stacked on the display screen 1 so that the display screen 1 may be heated by the electrically heated glass layer 2 in a low temperature environment, thereby solving problems that the liquid crystal display cannot work normally due to an increase of the viscosity coefficient of the liquid crystal and the weakening or disappearance of the electro-optic effect in the low temperature environment, and problems of longer startup time and longer response time of OLED display and LED display in low temperature environment. The positive electrode 231 and the negative electrode 232 provided on the transparent conductive film layer 22 of the electrically heated glass layer 2 are electrically connected to the flexible circuit board 3 to be supplied with the electrical power. The flexible circuit board 3 is plate-shaped, and connection ends of the flexible circuit board 3 connecting the positive electrode 231 and the negative electrode 232 may be in a strip shape or a sheet shape. In this way, the flexible circuit board 3 is connected to the positive electrode 231 and the negative electrode 232 in the form of a line connection or a surface connection, instead of point connection when a wire is connected to the positive electrode 231 and the negative electrode 232, thereby improving the connection strength. In addition, the portion of the flexible circuit board 3 connected to the positive electrode 231 and the negative electrode 232 is on the same flat layer as the transparent conductive film layer 22, and a part of the flexible circuit board 3 may be sandwiched in the layered display device, that is, sandwiched between the transparent the conductive film layer 22 and the display screen 1, thereby further increasing the connection strength of the flexible circuit board 3 with both the positive electrode 231 and the negative electrode 232. Moreover, one flexible circuit board 3 may be provided with multiple channels, that is, multiple connection terminals may be provided, and all the positive electrode 231, the negative electrode 232 and the thermistor 4 may be connected to the one flexible circuit board 3, thereby improving the integration of the internal structures of the display device, making the overall structure more compact, and achieving a thinner display device.

Optionally, as shown in FIG. 1, the display device provided by some embodiments of the present disclosure further includes: a first optical adhesive layer 5. The display screen 1, the first optical adhesive layer 5, and the transparent conductive film layer 22 and the first transparent glass layer 21 are sequentially stacked. As shown in FIG. 6, the flexible circuit board 3 may include a first portion 31 and a second portion 32. For example, the first portion 31 may include a connection portion of the flexible circuit board 3 with both the positive electrode 231 and the negative electrode 232 and a portion close to the connection portion, and the second portion 32 may include the bonding area 34 of the flexible circuit board 3 and a portion close to the bonding area 34. The first portion 31 of the flexible circuit board 3 is sandwiched between the transparent conductive film layer 22 and the display screen 1, and the first portion 31 of the flexible circuit board 3 and the first optical adhesive layer 5 are located on the same layer.

Specifically, the electrically heated glass layer 2 is provided on the surface of the display screen 1 on the side for displaying images, and the first optical adhesive layer 5 is disposed to reduce an influence on the display effect due to the added electrically heated glass layer. Moreover, the first optical adhesive layer 5 may also form a complete flat layer with the flexible circuit board 3, to avoid local sandwiched objects between the first transparent glass layer 21 and the display screen 1 due to the arrangement of the flexible circuit board 3, so as to avoid local deformation and arching. Optionally, the thickness of the first optical adhesive layer 5 is set to be substantially the same as the thickness of the flexible circuit board 3, or may be greater than the thickness of the flexible circuit board 3, to wrap the flexible circuit board 3. For example, the thickness of the first optical adhesive layer 5 may be set to be substantially the same as the sum of the thickness of the flexible circuit board 3 and the thickness of the electrical connection terminal 23.

Figure 2:
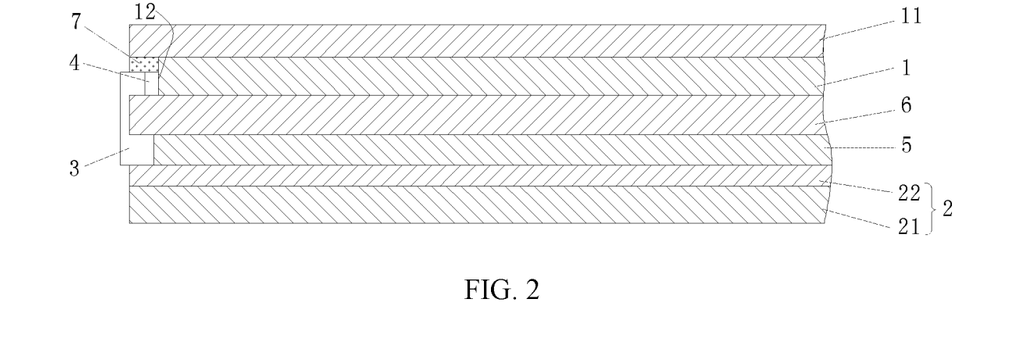

Optionally, as shown in FIG. 2, the display device provided by some embodiments of the present disclosure further includes: a second transparent glass layer 6, the second transparent glass layer 6 is disposed between the display screen 1 and the first optical adhesive layer 5.

Specifically, in the manufacturing process, the electrically heated glass layer 2 and the display screen 1 may be assembled in a fully bonding manner. Before the electrically heated glass layer 2 and the display screen 1 are assembled, the second transparent glass layer 6 may be assembled with the electrically heated glass layer 2 through the first optical adhesive layer 5 in advance, and the transparent conductive film layer 22 of the electrically heated glass layer 2 in the manufacturing process may be protected by the second transparent glass layer 6.

Figure 7:
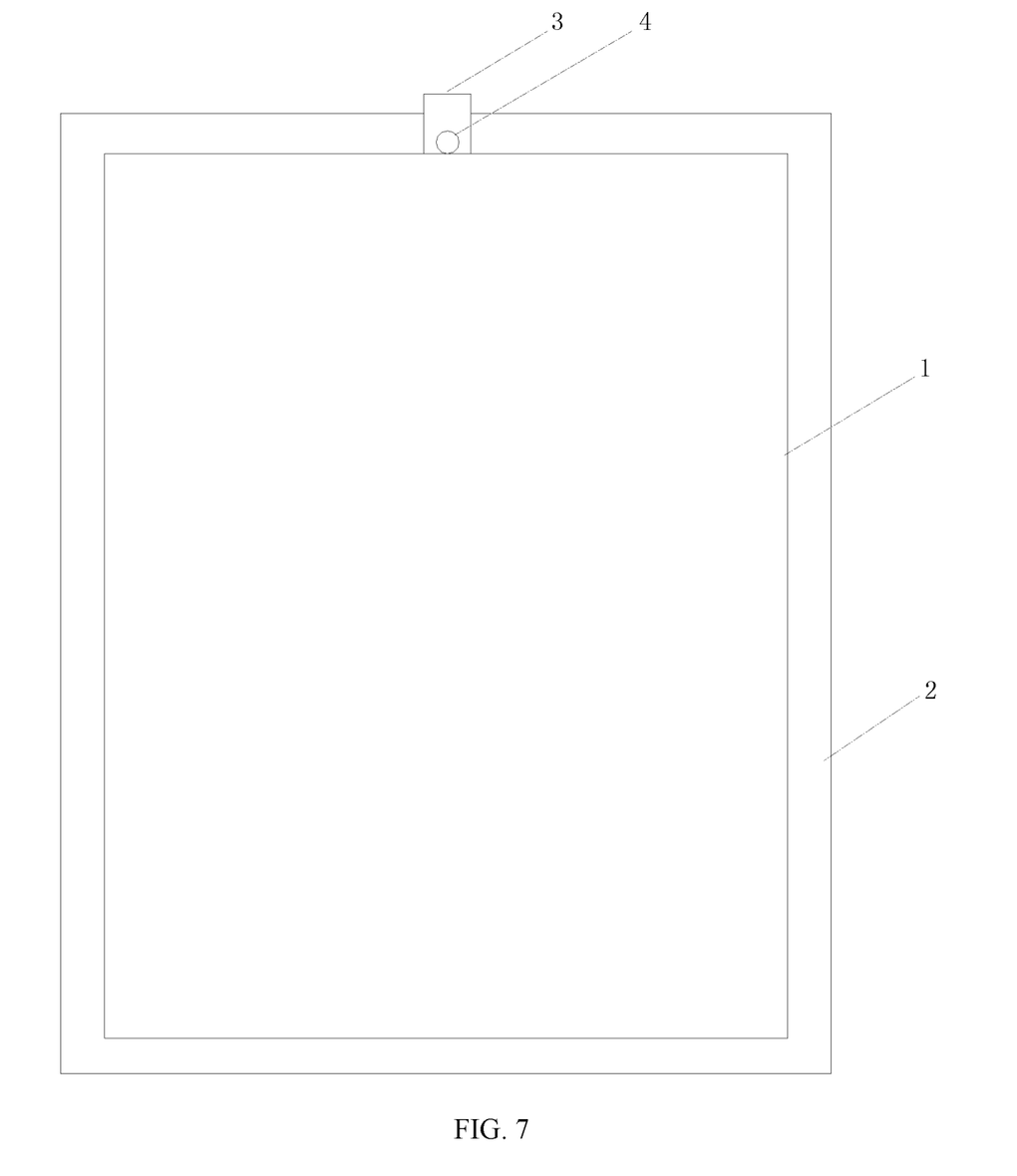
FIG. 7 is a top view of a display device according to some exemplary embodiments of the present disclosure.

Optionally, as shown in FIGS. 2, 6 and 7, a side of the flexible circuit board 3 is connected to the thermistor 4. The side of the flexible circuit board 3 is continuously bent to span a side end of the second transparent glass layer 6, so that the thermistor 4 is attached to the side end of the display screen 1.

Specifically, since the flexible circuit board 3 has a certain flexibility, that is, the flexible circuit board 3 may be bent, the thermistor 4 is disposed on the side end of the display screen 1 by utilizing this characteristic of the flexible circuit board 3, thereby effectively detecting the temperature change of the display screen 1.

In addition, the overall shape of the flexible circuit board 3 is not limited, and any side of the flexible circuit board 3 may be extended or expanded according to the specific connection position and manner with the main board of the electronic device.

Optionally, the number of the thermistors 4 may be multiple, and a plurality of the thermistors 4 are attached to the side end of the display screen 1 at an interval and are respectively connected to the flexible circuit board 3. In this way, the plurality of the thermistors 4 may feedback detection results to the processor 35 through the flexible circuit board 3, respectively.

Optionally, silica gel 7 is provided at the side end position of the display screen 1 where the thermistor 4 is attached, wherein the silica gel 7 has a good thermal conductivity effect to improve the detection accuracy of the thermistor 4. For example, as shown in FIG. 2, the display screen 1 has a side end 12, and the thermistor 4 and the silica gel 7 are both in contact with the side end 12 of the display screen 1. An orthographic projection of the silica gel 7 on the second transparent glass layer 6 at least partially overlaps an orthographic projection of the thermistor 4 on the second transparent glass layer 6.

Figure 3:
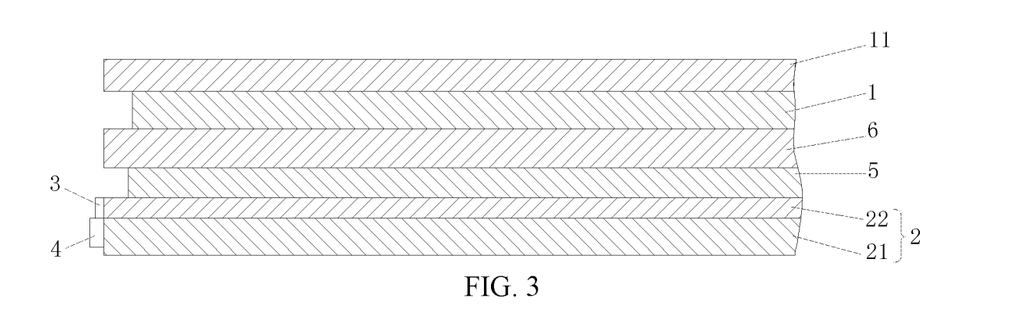

Optionally, as shown in FIG. 3, in the display device provided by the embodiments of the present disclosure, the thermistor 4 is arranged in another manner. The thermistor 4 may be attached to a side end of the first transparent glass layer 21 by bending the side of the flexible circuit board 3. Then, the temperature change of the first transparent glass 21 under the heating of the transparent conductive film layer 22 may be detected, so that the temperature change of the display screen 1 is determined.

Optionally, as shown in FIGS. 2 and 3, the display device provided by the embodiments of the present disclosure further includes a shielding glass layer 11, and the shielding glass layer 11 is bonded to the other surface of the display screen 1 opposite to the surface on which the electrically heated glass layer 2 is disposed. The shielding glass layer 11 is provided to avoid electromagnetic interference on the display function of the display screen 1.

As shown in FIG. 2, the silica gel 7 may be sandwiched between the thermistor 4 and the shielding glass layer 11, so that it is beneficial to form a good contact between the silica gel 7 and the thermistor 4.

Figure 4:
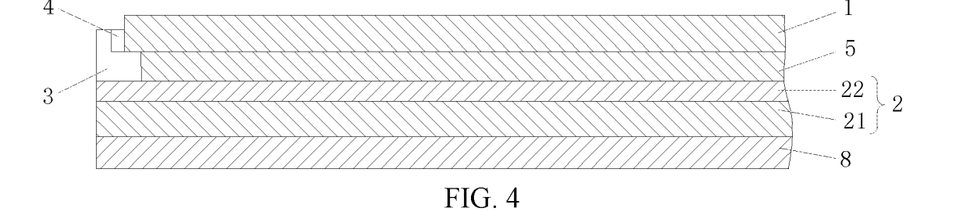

Optionally, as shown in FIG. 4, the display device provided by some embodiments of the present disclosure may further include: a display screen 1, a first optical adhesive layer 5, a transparent conductive film layer 22, a first transparent glass layer 21 and a third transparent glass layer 8 which are stacked in sequence. The third transparent glass layer 8 is bonded to the other surface of the first transparent glass layer 21 opposite to the surface connecting the transparent conductive film layer 22.

Specifically, the third transparent glass layer 8 is provided to effectively protect the electrically heated glass layer 2 and prevent the electrically heated glass layer 2 from being damaged.

Figure 5:
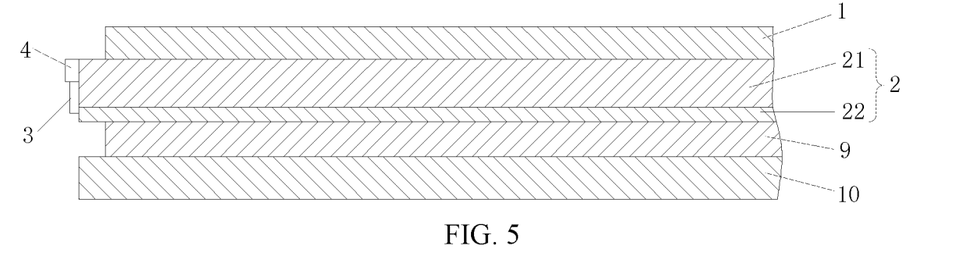

Optionally, as shown in FIG. 5, the display device provided by some embodiments of the present disclosure further includes: a second optical adhesive layer 9 and a fourth transparent glass layer 10. The display screen 1, the first transparent glass layer 21, the transparent conductive film layer 22, the second optical adhesive layer 9 and the fourth transparent glass layer 10 are sequentially stacked.

Figure 8:
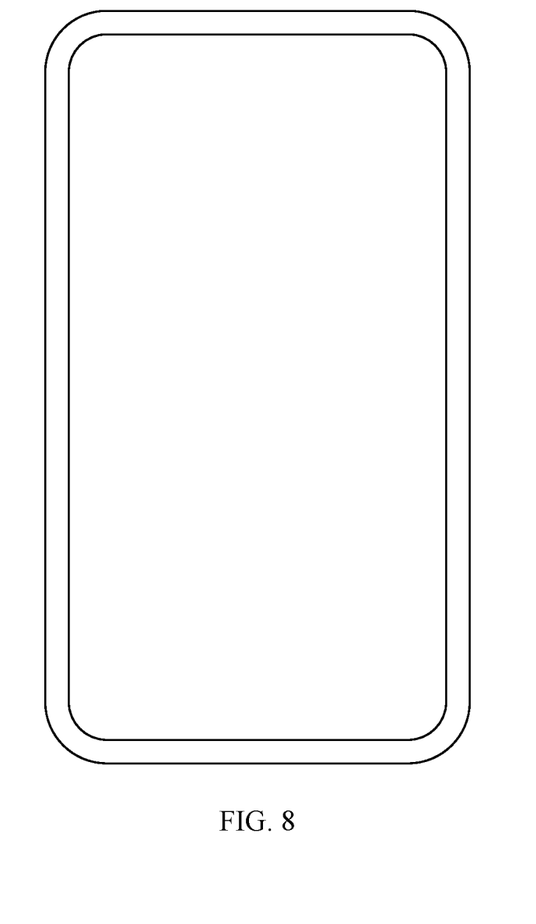
FIG. 8 is a schematic view of an electronic device according to some exemplary embodiments of the present disclosure.

Some exemplary embodiments of the present disclosure also propose an electronic device, as shown in FIG. 8. The electronic device may include a display device. For example, the display device may be the display device as shown in FIG. 1 to FIG. 7, specifically, the display device includes: a display screen 1 and an electrically heated glass layer 2 which are stacked onto each other. The electrically heated glass layer 2 includes a first transparent glass layer 21 and a transparent conductive film layer 22 which are stacked onto each other. A side edge of the transparent conductive film layer 22 is provided with a positive electrode 231 and a negative electrode 232, and the positive electrode 231 and the negative electrode 232 are both electrically connected to the flexible circuit board 3. The thermistor 4 is electrically connected to the flexible circuit board 3 and is disposed adjacent to the display screen 1, for detecting the temperature of the display screen 1. The flexible circuit board 3 is disposed along the side of the transparent conductive film layer 22, a part of the flexible circuit board 3 is located in a laminated structure of the display device, and the remaining part of the flexible circuit board 3 is located outside the laminating portion of the display screen 1 and the electrically heated glass layer 2, and is used to electrically connect the processor 35.

For example, the electronic device may be a smart phone, a portable phone, a navigation device, a television (TV), a car audio body, a laptop computer, a tablet computer, a portable multimedia player (PMP), a personal digital assistant (PDA), and so on. The electronic device may be configured as a pocket-sized portable communication terminal with wireless communication function. Moreover, the electronic device may be a flexible device or a flexible display device.

Optionally, the electronic device provided by the embodiments of the present disclosure further includes a power supply device 36. The power supply device 36 may supply electrical power to all the power-consuming components such as the processor, the display screen 1, the thermistor 4, and the like. The power supply device 36 is electrically connected to the transparent conductive film layer 22 of the electrically heated glass layer 2 through the flexible circuit board 3, and the power supply device 36 is also electrically connected to the processor 35. Under the control of the processor 35, the power supply device 36 may selectively supply power to the transparent conductive film layer 22.

The thermistor 4 is attached to the display screen 1 or arranged adjacent to the display screen 1, and the resistance value thereof may be changed according to the temperature change of the display screen 1 or the temperature change at the vicinity of the display screen 1. The processor 35 may obtain the temperature change of the display screen 1 or the temperature change at the vicinity of the display screen 1 according to the resistance value change of the thermistor 4. The processor 35 determines whether to send a signal to the power supply device 36 or not based on a preset temperature threshold. Under the control of the processor 35, the power supply device 36 may supply electrical power to the transparent conductive film layer 22.

For example, when the processor 35 determines that the temperature of the display screen 1 or the temperature at the vicinity of the display screen 1 at one moment is lower than the preset temperature threshold according to the resistance value change of the thermistor 4, the processor 35 controls the power supply device 36 to supply electrical power to the transparent conductive film layer 22, and the transparent conductive film layer 22 generates heat to heat the display screen, thereby solving the problem of abnormal operation of the display screen 1 in low temperature environment. Further, when the processor 35 determines that the temperature of the display screen 1 or the temperature at the vicinity of the display screen 1 is within the range of the preset temperature threshold according to the resistance value change of the thermistor 4, the processor 35 controls the power supply device 36 to stop supplying electrical power to the transparent conductive film layer 22, that is, to stop heating the display screen 1, thereby avoiding the problem of excessively high temperature of the display screen 1 caused by continuous heating.

Specifically, the display device described in the embodiments may directly use the display device provided in the above embodiments. For a specific implementation structure, reference may be made to the related content described in the above embodiments, and details are not described herein again. Wherein, the electronic device may be a computer, a mobile phone, and other electronic devices that need to display information.

In the electronic device provided by the embodiments of the present disclosure, the electrically heated glass layer 2 is stacked on the display screen 1 so that the display screen 1 may be heated by the electrically heated glass layer 2 in a low temperature environment, thereby solving problems that the startup time of the display screen 1 in low temperature environment is too long and the problem that the display screen 1 cannot display normally in low temperature environment. The positive electrode 231 and the negative electrode 232 provided on the transparent conductive film layer 22 of the electrically heated glass layer 2 are electrically connected to the flexible circuit board 3 to be supplied with the electrical power. The flexible circuit board 3 is plate-shaped, and connection ends of the flexible circuit board 3 connecting the positive electrode 231 and the negative electrode 232 may be in a strip shape or a sheet shape. In this way, the flexible circuit board 3 is connected to the positive electrode 231 and the negative electrode 232 in the form of a line connection or a surface connection, instead of point connection when a wire is connected to the positive electrode 231 and the negative electrode 232, thereby improving the connection strength. In addition, the portion of the flexible circuit board 3 connected to the positive electrode 231 and the negative electrode 232 is on the same flat layer as the transparent conductive film layer 22, and a part of the flexible circuit board 3 may be sandwiched in the layered display device, that is, sandwiched between the transparent the conductive film layer 22 and the display screen 1, thereby further increasing the connection strength of the flexible circuit board 3 with both the positive electrode 231 and the negative electrode 232. Moreover, one flexible circuit board 3 may be provided with multiple channels, that is, multiple connection terminals may be provided, and all the positive electrode 231, the negative electrode 232 and the thermistor 4 may be connected to the one flexible circuit board 3, thereby improving the integration of the internal structures of the display device, making the overall structure more compact, and achieving a thinner display device.

It should be noted that the processor described in the embodiments of the present disclosure may be implemented by an application specific integrated circuit (ASIC), a field programmable gate array (FPGA), a digital signal processor (DSP), or other integrated formats. However, those skilled in the art should recognize that some aspects of the embodiments of the present disclosure may be implemented in whole or in part in an integrated circuit equivalently, implemented as one or more computer programs running on one or more computers (e.g., implemented as one or more programs running on one or more computer systems), implemented as one or more programs running on one or more processors (e.g., implemented as one or more programs running on one or more microprocessors), implemented as firmware, or essentially implemented as any combination of the above manners. And those skilled in the art will have the ability to design circuits and/or write software and/or firmware codes according to the present disclosure. In addition, those skilled in the art will recognize that the mechanism involved in the processor of the embodiments of the present disclosure can be distributed as various forms of program products, regardless of the specific type of signal bearing medium that is actually used to perform the distribution. Examples of signal bearing media include, but are not limited to: recordable media such as floppy disks, hard drives, compact disks (CDs), digital versatile disks (DVDs), digital magnetic tapes, computer memories, etc.; and transmission media such as digital and/or analog communication media (e.g., fiber optic cables, waveguides, wired communication links, wireless communication links, etc.).

The above descriptions are only some embodiments of the present disclosure, and are not intended to limit the present disclosure in any way. Any simple modifications, equivalent changes, and modifications to the above embodiments based on the technical essence of the present disclosure still fall within the scope of the technical solutions of the present disclosure.

What is claimed is:

1. A display device, wherein the display device comprises:
   a display screen;
   an electrically heated glass layer stacked onto the display screen, the electrically heated glass layer comprising:
     a first transparent glass layer; and
     a transparent conductive film layer, the transparent conductive film layer and the first transparent glass layer being stacked onto the display screen;
   a thermistor disposed adjacent to the display screen, for detecting a temperature of the display screen or a temperature at a vicinity of the display screen; and
   a flexible circuit board,
   wherein an electrical connection terminal is provided on the transparent conductive film layer, the electrical connection terminal is electrically connected with the flexible circuit board, and the thermistor is electrically connected with the flexible circuit board.

2. The display device according to claim 1, wherein the electrical connection terminal comprises a positive electrode and a negative electrode, the positive electrode and the negative electrode are both disposed in a conductive layer on a surface of the transparent conductive film layer close to the display screen, and the flexible circuit board is electrically connected to the positive electrode and the negative electrode, respectively.

3. The display device according to claim 2, wherein the flexible circuit board is disposed along a side of the transparent conductive film layer, the flexible circuit board comprises a first portion, and the first portion of the flexible circuit board is sandwiched between the display screen and the transparent conductive film layer.

4. The display device according to claim 3, wherein an electrical connection between the flexible circuit board and each of the positive electrode and the negative electrode is a surface connection.

5. The display device according to claim 4, wherein the thermistor is adhered to the flexible circuit board, and a part of the flexible circuit board is bent so that the thermistor is in contact with a side end of the display screen.

6. The display device according to claim 4, wherein the display device further comprises:
   a first optical adhesive layer between the display screen and the transparent conductive film layer.

7. The display device according to claim 6, wherein the first portion of the flexible circuit board is located on the same layer as the first optical adhesive layer, and a thickness of the first optical adhesive layer is substantially equal to a sum of a thickness of the conductive layer and a thickness of the first portion of the flexible circuit board.

8. The display device according to claim 6, wherein the display device further comprises:
   a second transparent glass layer between the display screen and the first optical adhesive layer.

9. The display device according to claim 8, wherein the thermistor is adhered to the flexible circuit board, and a part of the flexible circuit board is bent so that the thermistor is in contact with a side end of the display screen and the bent flexible circuit board wraps a side end of the second transparent glass layer.

10. The display device according to claim 9, wherein the display device further comprises silica gel, the silica gel is in contact with the side end of the display screen, and the silica gel is in contact with the thermistor.

11. The display device according to claim 5, wherein there are a plurality of thermistors, and the plurality of thermistors are adhered to the side end of the display screen at an interval.

12. The display device according to claim 8, wherein the thermistor is adhered to the flexible circuit board, and a part of the flexible circuit board is bent so that the thermistor is in contact with a side end of the first transparent glass layer.

13. The display device according to claim 1, wherein the transparent conductive film layer is disposed between the display screen and the first transparent glass layer.

14. The display device according to claim 13, wherein the display device further comprises:
   a third transparent glass layer on a surface of the first transparent glass layer away from the transparent conductive film layer.

15. The display device according to claim 1, wherein the display device further comprises a second optical adhesive layer and the fourth transparent glass layer,
   wherein the display screen, the first transparent glass layer, the transparent conductive film layer, the second optical adhesive layer and the fourth transparent glass layer are sequentially stacked.

16. The display device according to claim 1, wherein the display device further comprises:
   a shielding glass layer on a surface of the display screen away from the electrically heated glass layer.

17. The display device according to claim 2, wherein the transparent conductive film layer comprises ITO, and/or the conductive layer comprises copper.

18. An electronic device, wherein the electronic device comprises the display device according to claim 1.

19. The electronic device according to claim 18, wherein the electronic device further comprises a processor, and the thermistor is electrically connected to the processor through the flexible circuit board, and
   the processor is configured to: determine a temperature change of the display screen according to a resistance value change of the thermistor; and output a control signal according to the temperature change of the display screen.

20. The electronic device according to claim 19, wherein the electronic device further comprises a power supply device, and the power supply device is electrically connected to the electrical connection terminal through the flexible circuit board, and
   the power supply device is configured to supply electrical power to the electrical connection terminal or stop supplying electrical power to the electrical connection terminal in response to the control signal.

* * * * *